United States Patent
Kazama et al.

(10) Patent No.: US 8,324,044 B2
(45) Date of Patent: Dec. 4, 2012

(54) METHOD OF PRODUCING A SEMICONDUCTOR DEVICE WITH AN ALUMINUM OR ALUMINUM ALLOY ELECTRODE

(75) Inventors: Kenichi Kazama, Nagano (JP); Tsunehiro Nakajima, Nagano (JP); Koji Sasaki, Nagano (JP); Akio Shimizu, Nagano (JP); Takashi Hayashi, Nagano (JP); Hiroki Wakimoto, Nagano (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/971,173

(22) Filed: Dec. 17, 2010

(65) Prior Publication Data

US 2011/0086471 A1   Apr. 14, 2011

Related U.S. Application Data

(63) Continuation of application No. 11/454,121, filed on Jun. 16, 2006, now Pat. No. 7,897,452.

(30) Foreign Application Priority Data

Jun. 20, 2005   (JP) .................. 2005-179720

(51) Int. Cl.
*H01L 21/8249*   (2006.01)
(52) U.S. Cl. ................ 438/234; 438/309; 257/E21.382
(58) Field of Classification Search .......... 438/203, 438/204, 208, 220, 235, 236, 313, 318, 354, 438/356; 257/E21.35, E21.372, E21.382
See application file for complete search history.

(56) References Cited

U.S. PATENT DOCUMENTS

| | | | |
|---|---|---|---|
| 5,451,544 | A | 9/1995 | Gould |
| 5,589,408 | A | 12/1996 | Robb et al. |
| 5,608,237 | A | 3/1997 | Aizawa et al. |
| 2001/0017377 | A1 | 8/2001 | Ikuhashi |
| 2002/0127783 | A1 | 9/2002 | Otsuki et al. |
| 2005/0024079 | A1 | 2/2005 | Honda et al. |
| 2007/0018241 | A1 | 1/2007 | Amali |
| 2007/0023081 | A1 | 2/2007 | Johnson et al. |

FOREIGN PATENT DOCUMENTS

| | | |
|---|---|---|
| CN | 2399828 Y | 10/2000 |
| JP | 03-044921 A | 2/1991 |
| JP | 07-307469 A | 11/1995 |
| JP | 10-163467 A | 6/1998 |
| JP | 2001-135814 A | 5/2001 |
| JP | 2002-299623 A | 10/2002 |
| JP | 2002314084 A | 10/2002 |
| JP | 02343980 | 11/2002 |
| JP | 2004-119498 A | 4/2004 |
| JP | 2005-019830 A | 1/2005 |

*Primary Examiner* — Cheung Lee
(74) *Attorney, Agent, or Firm* — Rabin & Berdo, P.C.

(57) ABSTRACT

A method of producing a semiconductor device that has a silicon substrate including a first major surface and a second major surface thereof, a front surface device structure being formed in a region of the first major surface, the method has a step of forming a rear electrode in a region of the second major surface, which includes evaporating or sputtering aluminum-silicon onto the second major surface to form an aluminum silicon film as a first layer of the rear electrode, the aluminum silicon film having a silicon concentration of at least 2 percent by weight when the thickness thereof is less than 0.3 µm.

6 Claims, 25 Drawing Sheets

METHOD OF PRODUCING A SEMICONDUCTOR DEVICE WITH AN ALUMINUM OR ALUMINUM ALLOY ELECTRODE

CROSS-REFERENCE TO RELATED APPLICATION

This application is a continuation application of U.S. patent application Ser. No. 11/454,121, which is in turn based on, and claims priority to, Japanese Patent Application No. 2005-179720, filed on Jun. 20, 2005, the contents of which are incorporated herein by reference.

BACKGROUND OF THE INVENTION

1. Field of the Invention

The present invention relates to a method of producing a semiconductor device, in particular, a power semiconductor device that can be applied to power conversion apparatuses, has a thickness between 90 to 200 μm, and is provided with an electrode on the rear surface of the device.

2. Description of Related Art

An IGBT (insulated gate bipolar transistor), a type of power semiconductor device, is a one-chip power device that gives a high speed switching characteristic and voltage-driving ability, which are specialties of MOSFETs (or insulated gate type field effect transistors), and a low forward voltage drop characteristic, which is a specialty of bipolar transistors. Applications of IGBTs have been expanded from industrial fields such as general purpose inverters, AC servo systems, uninterruptible power supplies (UPS), and switching power supplies, to consumer appliances such as microwave ovens, electric rice cookers, and electric flash lights. IGBTs with low forward voltage drop are being developed employing newly devised chip structures and promoting loss reduction and efficiency improvement of apparatuses using the IGBTs.

IGBTs include punch-through type (PT type), non punch-through type (NPT type), and field stop type (FS type). A common type of structure is an n channel, vertical double diffusion structure, except in special applications. Accordingly, the following description will be based on examples of n channel IGBTs, although the description is similarly applicable to p channel IGBTs.

A PT type IGBT uses an epitaxial substrate that is formed by epitaxially growing an n+ buffer layer and an n– active layer on a p$^+$ semiconductor substrate. In an example of a device having a withstand voltage of 600 V, while a thickness of about 100 μm is enough for an active layer, an overall thickness including the p$^+$ semiconductor substrate needs to be a relatively large value in the range of 200 to 300 μm. Moreover, the epitaxial substrate is costly.

For reducing costs, NPT type or FS type IGBTs using an FZ substrate instead of the epitaxial substrate have been developed. The FZ substrate is cut from a semiconductor ingot made by a floating zone (FZ) process. These types of IGBTs have a shallow p+ collector layer with low dose (low injection p+ collector) formed in the rear surface region of the device.

FIG. 1 is a sectional view showing a structure of an NPT type IGBT produced using an FZ substrate. As shown in FIG. 1, an n– semiconductor substrate composed of an FZ substrate is used for an active layer 1 and both a p$^+$ base region 2 and an n$^+$ emitter region 3 are selectively formed in the front surface region of the substrate. On the substrate surface, a gate electrode 5 is formed through a gate oxide film 4. An emitter electrode 6 is in contact with the emitter region 3 and the base region 2, and insulated from the gate electrode 5 by the interlayer insulation film 7.

A p$^+$ collector layer 8 and a collector electrode 9 are formed in the rear surface region of the substrate. The overall thickness of the substrate is significantly thinner in an NPT type than in a PT type. Hole injection rate being controllable, high speed switching is possible without life time control. Use of an FZ substrate in place of an epitaxial substrate achieves a low cost.

FIG. 2 is a sectional view showing a structure of an FS type IGBT. As shown in FIG. 2, the device structure in the front surface region of the substrate is the same as that in the NPT type of FIG. 1. In the rear surface region of the substrate, an n buffer layer 10 is provided between an n– active layer 1 and a p$^+$ collector layer 8. An overall thickness of the substrate in the range of 100 μm to 200 μm is achieved in the FS type by using an FZ substrate.

The active layer 1, being depleted similarly to the case of the PT type, has a thickness of about 100 μm in a device with a withstand voltage of 600 V. Life time control is not needed as in the case of the NPT type. In order to further reduce a forward voltage drop, a type of IGBT combining a trench structure and an FS type structure has been recently proposed. The trench structure has a narrow, deep groove formed in the chip surface region and a MOSFET structure beside the groove.

In producing an FS type IGBT using an FZ substrate, a surface device structure is first fabricated in the substrate surface region. After that, the rear surface of the substrate is ground to make the substrate thinner. Then, two types of ions are injected from the rear surface of the substrate with a reduced thickness, to form a buffer layer 10 and a collector layer 8 in the rear surface region of the substrate through an activation heat treatment. Finally, a collector electrode 9 is formed of aluminum or another metal on the surface of collector layer 8 by evaporation or sputtering.

There is also a need for IGBTs exhibiting reverse withstand ability (reverse blocking IGBTs), suitable for use in matrix converters. An n channel reverse blocking IGBT, for example, has a high concentration p type isolation region formed in the side region of a normal n channel IGBT and connecting to a collector layer. In producing a reverse blocking IGBT using an FZ substrate, an isolation region is first formed by selective diffusion of impurities from the front surface of the substrate. After that, similar to the case of the FS type IGBT, sequentially conducted are: fabrication of a surface device structure, grinding the rear surface of the substrate, ion implantation into the rear surface region of the substrate, activation heat treatment, and evaporation or sputtering to form a collector electrode.

In an FS type IGBT, the buffer layer is subjected to a high electric field when a forward bias voltage is applied; in a reverse blocking IGBT, a PN junction at the rear surface side of the device is subjected to a high electric field when a reverse bias voltage is applied. Because the PN junction in these devices is located at a shallow depth of about 0.3 μm in the rear surface region, a small flaw in the rear surface region can cause a punch-through phenomenon leading to loss of device function.

Evaporation or sputtering of a metal such as aluminum for the collector electrode is apt to generate spikes 11 of the metal protruding to the silicon substrate at the interface between a collector layer 8 of silicon and a collector electrode 9 of a metallic electrode as shown in FIG. 3. If a spike 11 reaches a buffer layer 10 in an FS type IGBT, unfavorable leakage current results. If a spike 11 reaches a PN junction in a reverse blocking type IGBT, insufficient reverse withstand voltage and unfavorable reverse leakage current result. It is essential for the above-mentioned thin IGBT having a thin collector layer to be formed with a metallic electrode on the rear surface of the substrate to avoid generation of the spikes 11 in order to reduce the proportion of defective devices.

Japanese Patent Unexamined Publication No. 2002-343980 discloses a discrete variable capacitance diode for use in high frequency circuits in which spikes of aluminum into a silicon diffusion layer are avoided by forming an anode electrode using aluminum-silicon with a silicon concentration of 3% to 5%. Japanese Patent Unexamined Publication No. 2002-343980 also discloses that an aluminum-silicon electrode with a silicon concentration in the range of 1 to 2% has been used to avoid aluminum spikes in large scale integrated circuits (LSI) according to the prior art.

The aluminum-silicon electrode disclosed in Japanese Patent Unexamined Publication No. 2002-343980, however, is especially suited for discrete variable capacitance diodes or LSIs, but not suited to avoiding generation of aluminum spikes in a rear surface electrode of power semiconductor devices such as IGBTs. In particular, in a power semiconductor device in which ion implantation has been conducted on a rear surface of the substrate made thin by a back grinding process and a shallow impurity diffusion layer has been formed along the rear surface of the substrate, the silicon concentration in the aluminum-silicon electrode must be optimized to avoid generation of aluminum spikes. Further, because the substrate after the back grinding is very thin, a thick aluminum-silicon electrode causes warping in the substrate and undesirably generates cracks in the substrate. Therefore, the thickness of the aluminum-silicon electrode must be optimized, too.

SUMMARY OF THE INVENTION

In light of the above-described problems in the prior art, an object of the present invention is to provide a method of producing a semiconductor device having a thickness of 90 to 200 μm, provided with an electrode on the rear surface of the device, and exhibiting a high proportion of non-defectives, by optimizing thickness and silicon concentration in the rear electrode, which is composed of aluminum-silicon or the like.

To solve the above problems and achieve the object, the method of producing a semiconductor device according to the invention features the following. In the case of producing an FS type IGBT, a surface device structure is first formed in the region of a first major surface of a silicon substrate. After working on a second major surface to reduce the substrate to a thickness in the range of 50 μm to 200 μm, a buffer layer and a collector layer are formed in the region of the second major surface by ion implantation, for example. After that, an aluminum-silicon film, which is a rear electrode, is formed in contact with the collector layer.

The silicon concentration of the aluminum-silicon film is preferably at least 0.5 percent by weight. The thickness of the aluminum-silicon film is preferably in the range of 0.3 μm to 1.0 μm. When the thickness of the aluminum-silicon film is in this range, the silicon concentration of the aluminum-silicon film is preferably at most 2.0 percent by weight, more preferably at most 1 percent by weight. A buffer metal film of titanium or molybdenum can be formed on the surface of the aluminum-silicon film. A soldering metal film can be formed on the buffer metal film, and a protective metal film can be formed on the soldering metal film.

In the case of producing a reverse blocking IGBT, a film of aluminum or an aluminum alloy having a thickness of at least 0.3 μm is formed in contact with the collector layer for a rear electrode. A silicon concentration in the aluminum alloy film need not be specified. When the aluminum alloy film is thinner than 0.3 μm, say about 0.1 μm, the rear electrode can be composed of an aluminum alloy film with a silicon concentration of 2 percent by weight or more in contact with the collector layer. This measure can be applied to an FS type IGBT. The method of the invention prevents generation of aluminum spikes that causes leakage current defects, reverse withstand voltage defect, and reverse leakage current defects.

According to a method of producing a semiconductor device of the invention, the generation of aluminum spikes can be avoided by optimizing a thickness and silicon concentration of the rear electrode, which is composed of aluminum-silicon or the like. Therefore, the method of the invention has an effect of producing, with a high proportion of non-defective devices, semiconductor devices having a thickness in the range of 90 μm to 200 μm and provided with an electrode on the rear surface of the device.

DETAILED DESCRIPTION OF THE INVENTION

Now, some preferred embodiments according to a method of producing a semiconductor device will be described in detail with reference to the accompanying drawings. In the specification and drawings, a layer or region preceded by the letter n or p means that the majority carriers are electrons or holes, respectively, in the layer or region. The signs "+" or "−" put on the n or p means higher impurity concentration or lower impurity concentration, respectively, than in a layer or region without the sign. In the description of embodiments and accompanying drawings, like symbols are given to like components.

DETAILED DESCRIPTION OF THE DRAWINGS

First Embodiment

Figure 1:
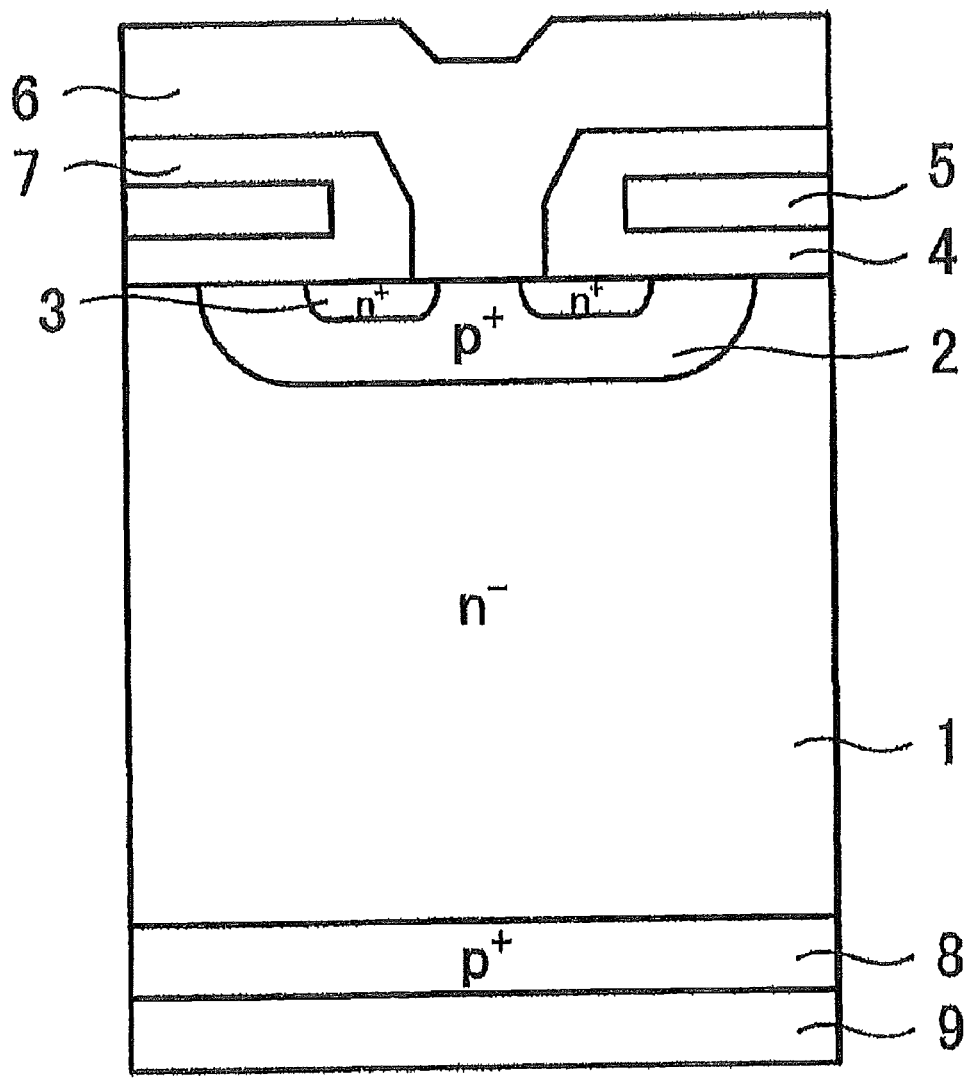
FIG. 1 is a sectional view of a structure of an NPT type IGBT.
Figure 2:
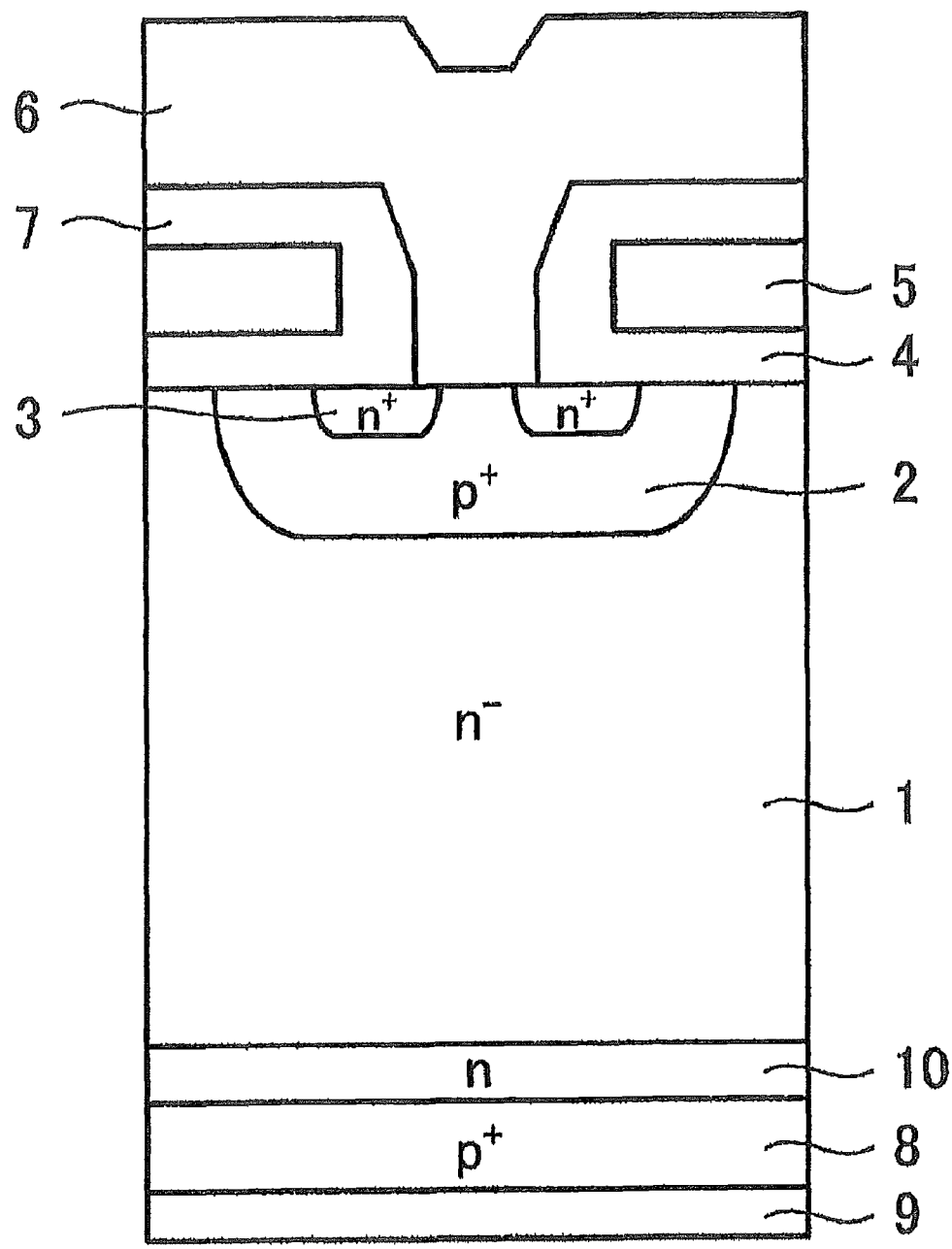
FIG. 2 is a sectional view of a structure of an FS type IGBT.
Figure 3:
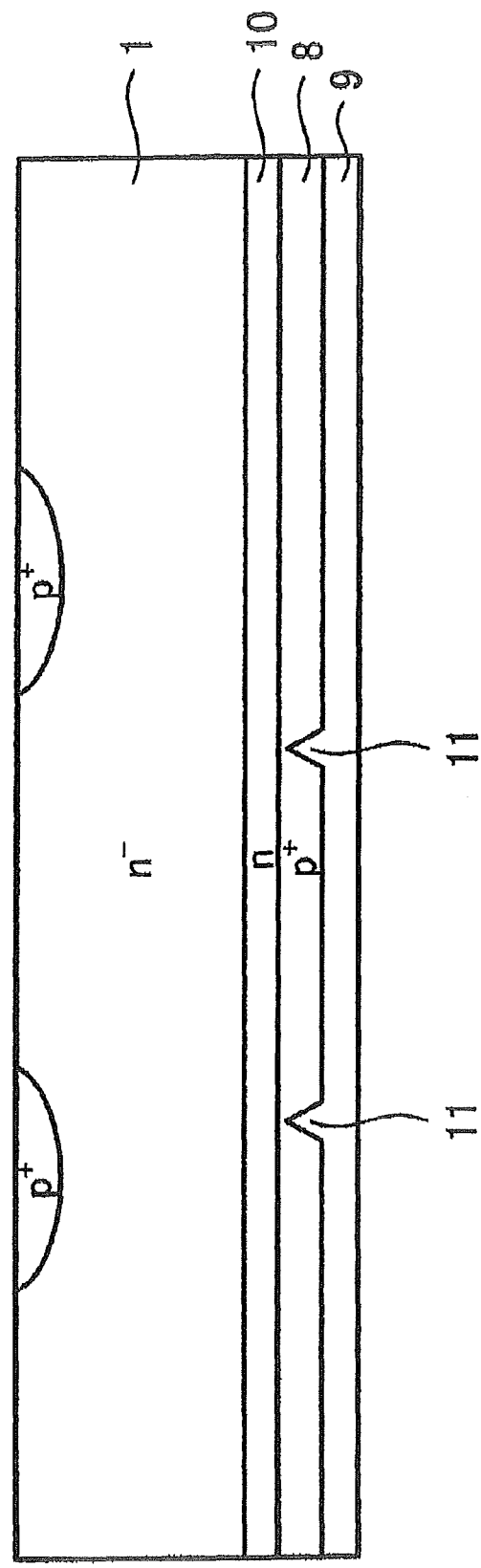
FIG. 3 is a sectional view showing spikes protruding from a metal electrode into a silicon layer.
Figure 4:
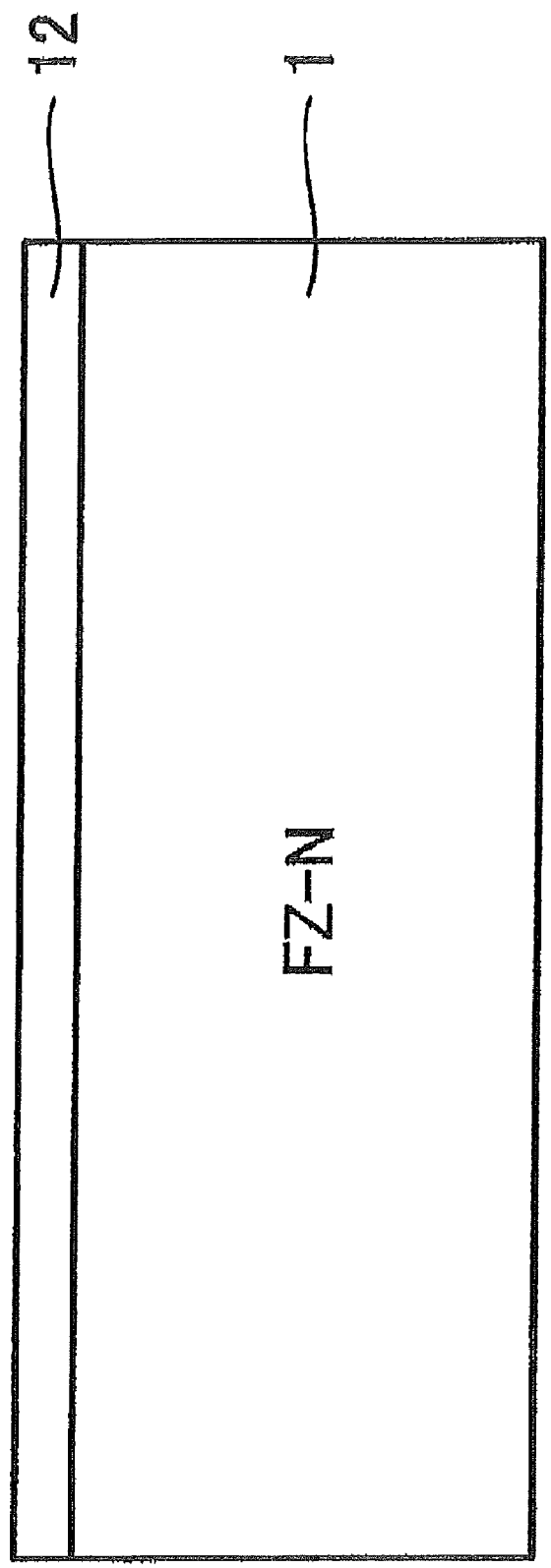
FIG. 4 is a sectional view of an FS type IGBT to illustrate a production method of the first embodiment.

FIG. 2 and FIG. 4 through 8 are sectional views illustrating a method of producing an FS type IGBT according to the invention. Referring to FIG. 2 and FIG. 4, in the front surface region of an n− FZ substrate (FZ-N), which works as an active layer (a drift layer) 1, a front surface region device structure 12 is first formed consisting of a base region, an emitter region, a gate oxide film, a gate electrode, an interlayer insulation film, an emitter electrode, and an insulation protective film (omitted in FIG. 2).

The gate oxide film may be made of silicon oxide ($SiO_2$), for example. The gate electrode may be made of polysilicon, for example. The interlayer insulation film may be made of BPSG, for example. The emitter electrode may be made of aluminum-silicon, for example. The aluminum-silicon film is heat treated at a relatively low temperature in the range of 350° C. to 450° C. in order to obtain a low resistance wiring with stable joining ability. The insulation protective film may be made of polyimide, for example.

Figure 5:
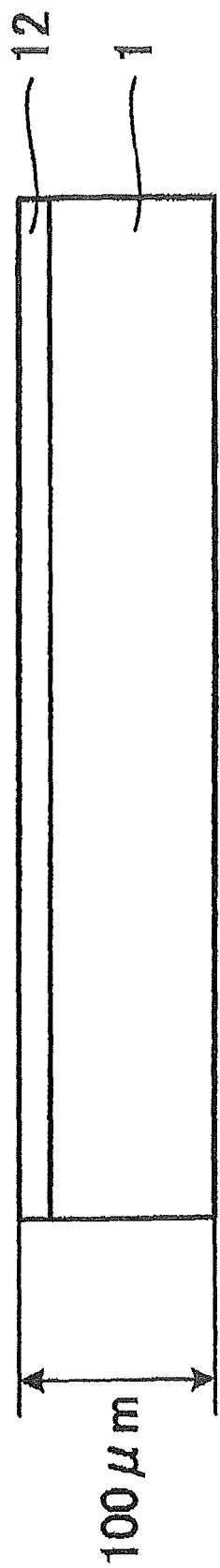
FIG. 5 is a sectional view of an FS type IGBT to illustrate a production method of the first embodiment.

Then, as shown in FIG. 5, the rear surface of the substrate is ground by one or more methods that may be selected from back grinding, polishing, and etching (these are referred to as "back grinding or the like") to produce a substrate with a thickness in the range of 50 μm to 200 μm, say 100 μm. Although etching is not strictly grinding, the means to decrease a thickness of the substrate is not limited in this specification and etching is also regarded as a means of grinding.

Figure 6:
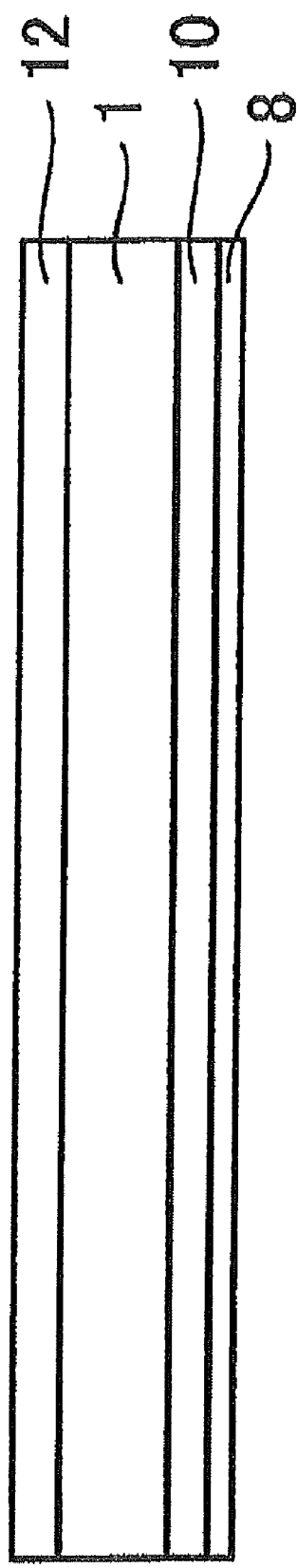
FIG. 6 is a sectional view of an FS type IGBT to illustrate a production method of first embodiment.
Figure 7:
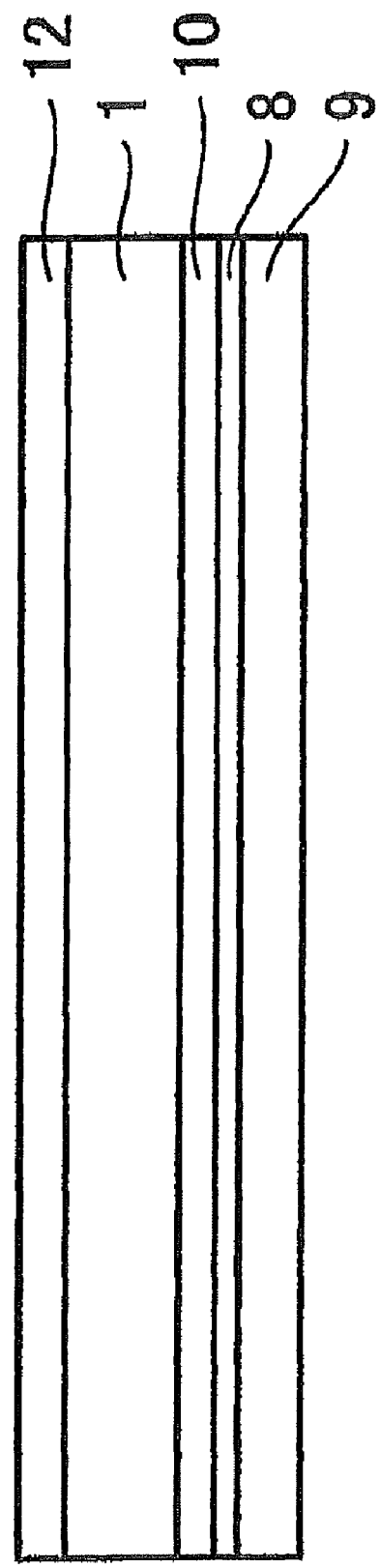
FIG. 7 is a sectional view of an FS type IGBT to illustrate a production method of the first embodiment.

Then, as shown in FIG. 6, phosphorus, n type ions, and boron, p type ions, are implanted from the rear surface of the substrate followed by heat treatment (e.g. annealing) in an electric furnace at a temperature between 350° C. and 450° C., to form a buffer layer 10 and a collector layer 8 in the rear surface region of the substrate. After that, as shown in FIG. 7, an aluminum-silicon film, a conductive film, is formed by evaporation or sputtering as a first layer of a multilayered collector electrode (rear electrode) 9 on the collector layer 8, that is, on a rear surface of the substrate.

The aluminum-silicon film is formed so that the silicon concentration is in the range of 0.5 percent to 2 percent by weight, preferably not more than 1 percent by weight, and the thickness is at least 0.3 μm. A thickness of the aluminum-silicon film more than 1.0 μm would be unfavorable, because warping in the substrate would then become significant, increasing assembly defects. Forming an aluminum-silicon film under the conditions specified above prevents the generation of aluminum spikes. Consequently, the proportion of defective devices is reduced.

Subsequently to the aluminum-silicon film, a plurality of metal films of titanium, nickel, and gold are deposited by evaporation or sputtering to form a complete collector electrode 9. The titanium film, the nickel film, and the gold film are employed as a buffer metal film, a soldering metal film, and a protective metal film, respectively, and it will be appreciated by those skilled in the art that other metals may be employed without departing from the scope of the invention. The buffer metal film can also be formed of molybdenum, for example.

Figure 8:
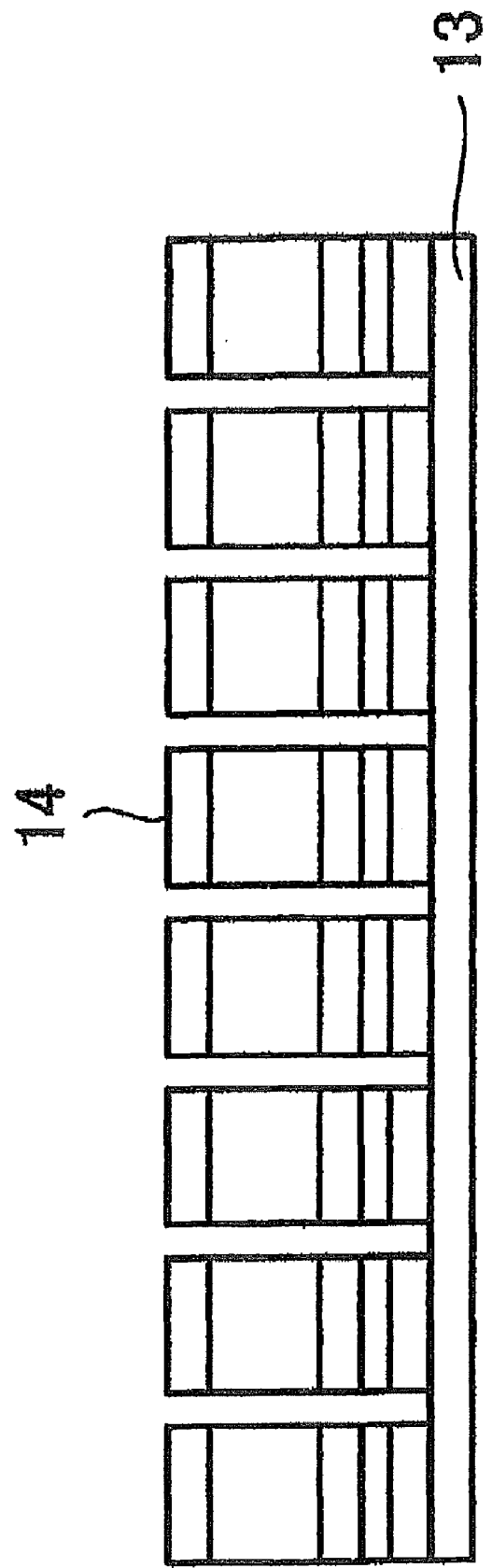
FIG. 8 is a sectional view of an FS type IGBT to illustrate a production method of the first embodiment.

Finally, as shown in FIG. 8, a dicing tape 13 is stuck on the side of the collector electrode 9, to divide into plural chips 14. Each chip 14 is mounted in various apparatuses, in which the collector electrode 9 is soldered to an anchoring member of the apparatus and the surface electrodes including the emitter electrodes of the chip are affixed with aluminum wiring electrodes to the apparatus by an ultrasonic wire bonding device.

Figure 9:
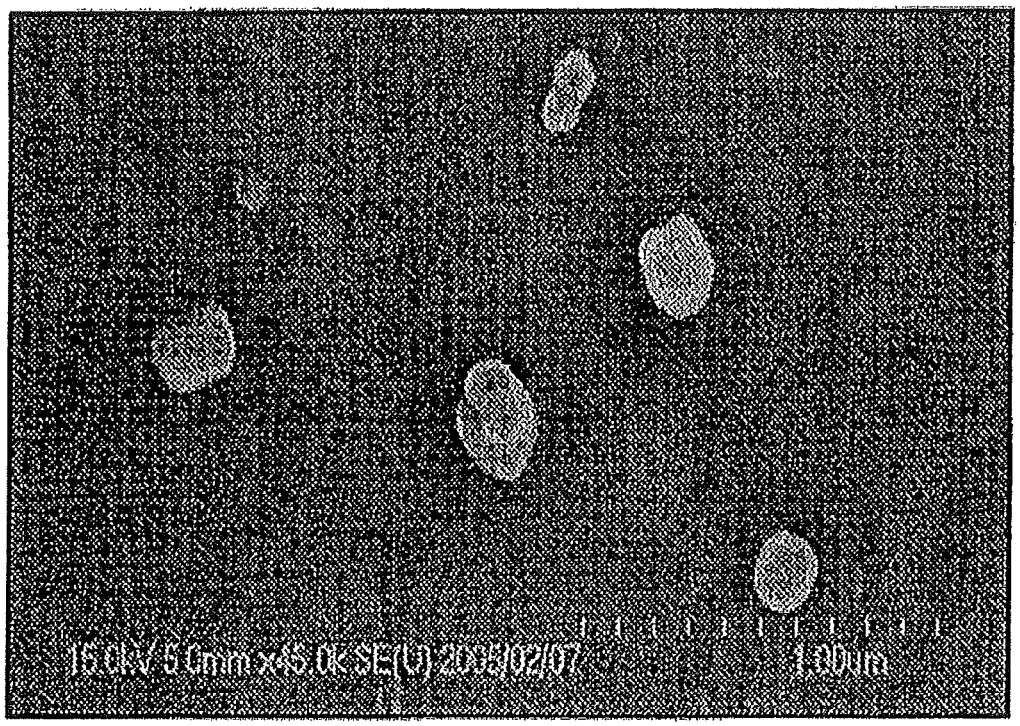
FIG. 9 is an electron micrograph of a silicon surface after removing an aluminum-silicon film.
Figure 10:
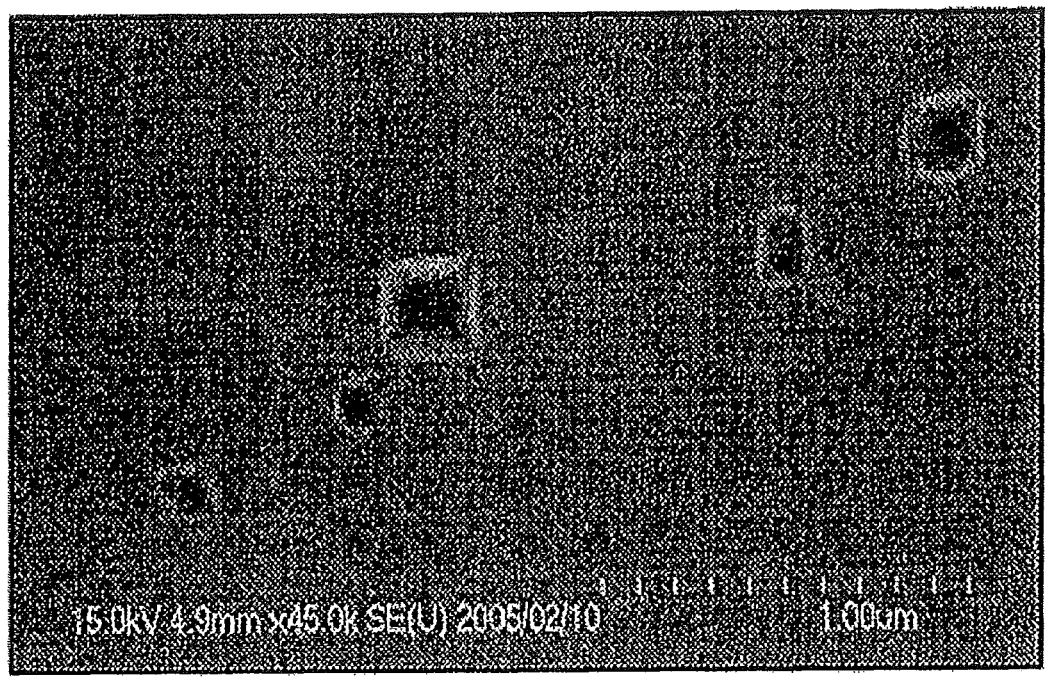
FIG. 10 is an electron micrograph of a silicon surface after removing an aluminum film.

FIG. 9 is an electron micrograph showing a surface condition of a silicon surface that was prepared by the following process. An aluminum-silicon film was formed by evaporation or sputtering under the above-described conditions of thickness and silicon concentration, and then, the aluminum-silicon film was removed using aqua regia to expose a silicon surface. FIG. 10 is an electron micrograph of a surface condition that was prepared by first forming an aluminum film in place of aluminum-silicon film and then removing the aluminum film by aqua regia to expose a silicon surface. Flaws generated by aluminum-spikes can be observed in FIG. 10, but no flaw can be seen in FIG. 9. This illustrates that the first embodiment prevents the generation of aluminum spikes.

When the first layer of the collector electrode in contact with the collector layer 8 is an aluminum film having a thickness not less than 0.3 μm, generation of aluminum spikes is reduced. When the first layer is an aluminum alloy film (silicon concentration thereof is not specified) having a thickness not less than 0.3 μm, the generation of aluminum spikes is avoided or at least reduced. When the first layer of the collector electrode 9 is an aluminum alloy film having a thickness smaller than 0.3 μm for example a thickness of about 0.1 μm, the aluminum alloy film preferably contains silicon in a concentration of at least 2 percent by weight. This condition can also prevent generation of aluminum spikes. These points will be described in detail below, in reference to the second embodiment.

Second Embodiment

Figure 11:
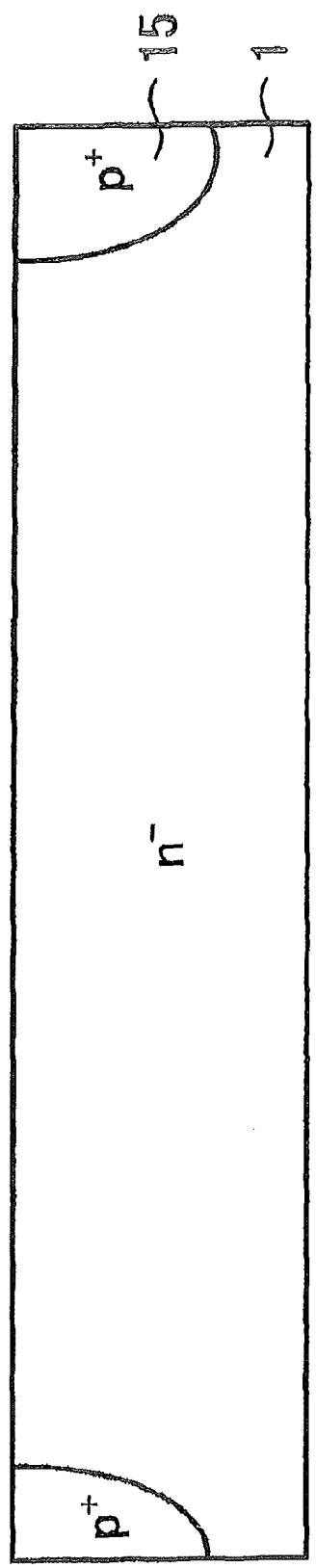
FIG. 11 is a sectional view of a reverse blocking type IGBT to illustrate a production method of the second embodiment.

FIGS. 11 through 14 are sectional views illustrating a method of manufacturing a reverse blocking IGBT according to the present invention. Referring to FIG. 11, a p type isolation region 15 is first formed in an n− FZ substrate that works as an active layer (a drift layer) 1 by selective thermal diffusion of p type ions from above. To produce a device of a rating voltage of 1,200 V, the p type ions are diffused to a depth of about 200 μm.

Figure 12:
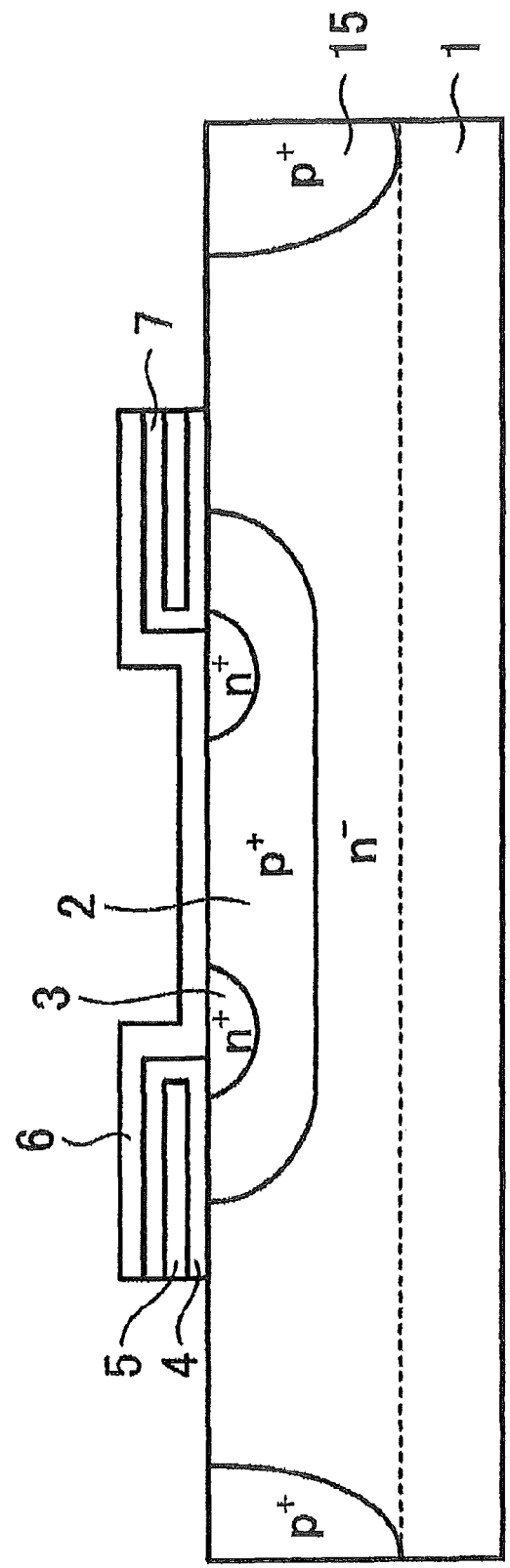
FIG. 12 is a sectional view of a reverse blocking type IGBT to illustrate a production method of the second embodiment.

Subsequently, as shown in FIG. 12, a front surface side device structure is formed in the surface region of the FZ substrate surrounded by the isolation region 15, the device structure being composed of a base region 2, an emitter region 3, a gate oxide film 4, a gate electrode 5, an interlayer insulation film 7, and emitter electrode 6, and an insulation protective film (not shown in the figure). Then, the rear surface of the substrate is ground by back grinding or the like, until the isolation region 15 is exposed as indicated by a dotted line in FIG. 12.

Figure 13:
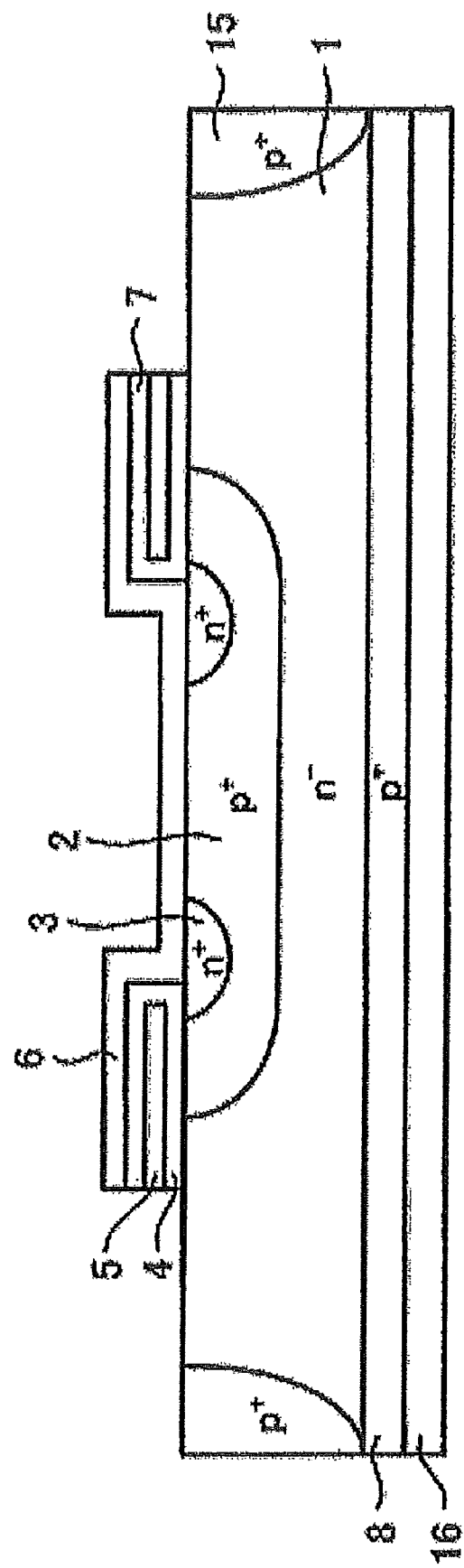
FIG. 13 is a sectional view of a reverse blocking type IGBT to illustrate a production method of the second embodiment.

Then, as shown in FIG. 13, p type ions are implanted from the rear surface of the substrate, followed by heat treatment (annealing), to form a collector layer 8 in the rear surface region of the substrate. After that, on the surface of the collector layer 8, aluminum film 16 is deposited by evaporation or sputtering as a conductive film of a first layer of a multilayer collector electrode (a rear electrode) 9. When the thickness of the aluminum film 16 is at least 0.3 μm, for example 0.6 μm, generation of aluminum spikes is reduced. Therefore, the proportion of defective devices is reduced.

Figure 14:
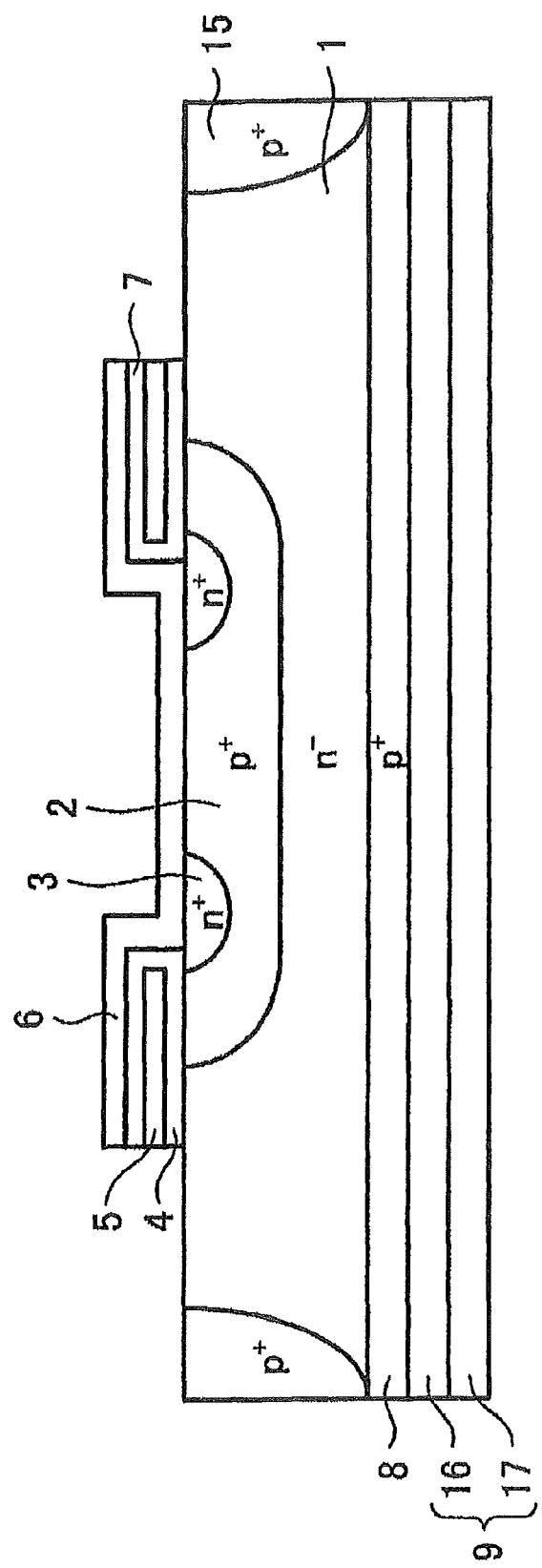
FIG. 14 is a sectional view of a reverse blocking type IGBT to illustrate a production method of the second embodiment.

Subsequently to forming the aluminum film 16, as shown in FIG. 14, a metal film 17 including a plurality of metallic films of titanium, nickel, gold, or the like is formed by evaporation or sputtering to form a complete collector electrode 9. Finally, dicing is conducted to divide the substrate into a plurality of chips, similarly to the first embodiment.

The same effect can be obtained when the first layer of the collector electrode 9 that is in contact with the collector layer 8 is composed of an aluminum alloy film (irrespective of silicon concentration) having a thickness of at least 0.3 μm. When the aluminum alloy film is thinner than 0.3 μm, for example 0.1 μm, the aluminum alloy film preferably contains silicon in an amount of at least 2 percent by weight. This measure prevents the generation of aluminum spikes as well.

Figure 15:
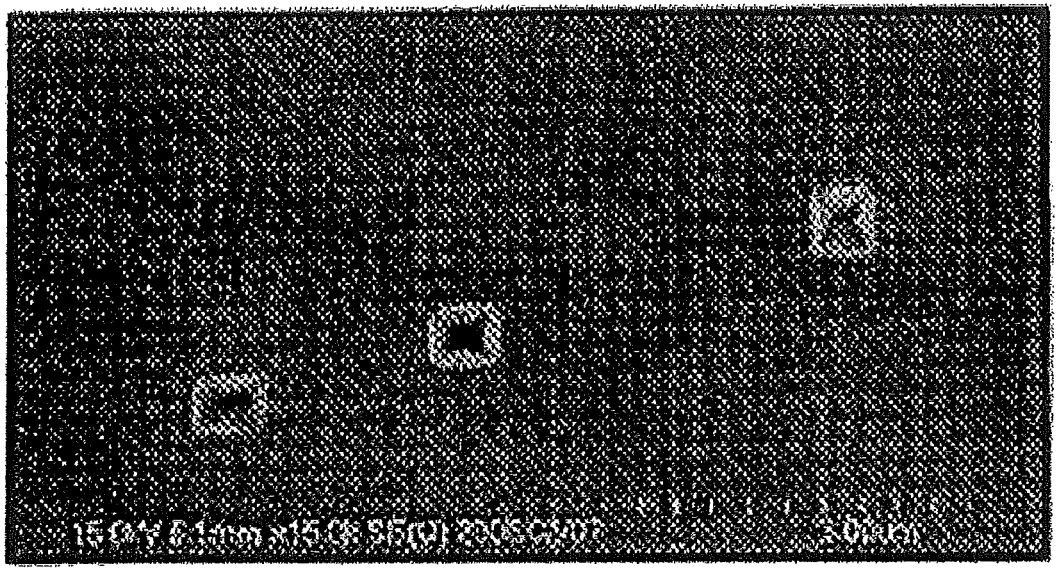
FIG. 15 is an electron micrograph of a silicon surface after removing an aluminum film.
Figure 16:
FIG. 16 is an electron micrograph of a silicon surface after removing an aluminum film.
Figure 17:
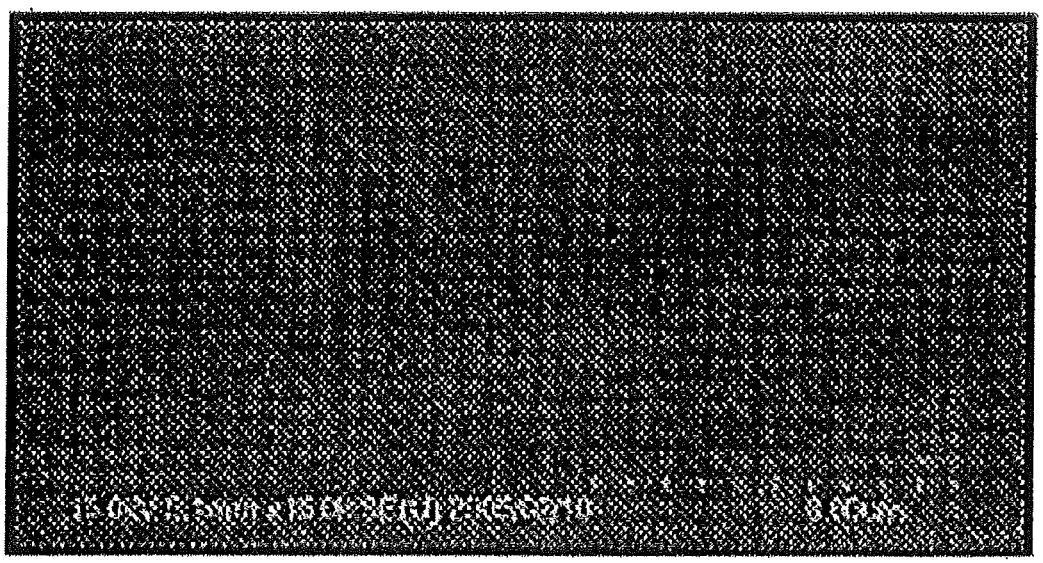
FIG. 17 is an electron micrograph of a silicon surface after removing an aluminum film.

FIGS. 15 through 17 are electron micrographs showing the surface conditions of the samples that were prepared by forming a multilayered electrode, the first layer of which is an aluminum film, on a silicon surface by means of evaporation or sputtering, followed by heat treatment, and then removing the electrode using aqua regia to expose the silicon surface. FIG. 15 is a photo of the sample with an aluminum film thickness of 0.1 μm. Flaws about 0.2 μm deep are observed that were generated by aluminum spikes on the silicon surface.

Figure 18:
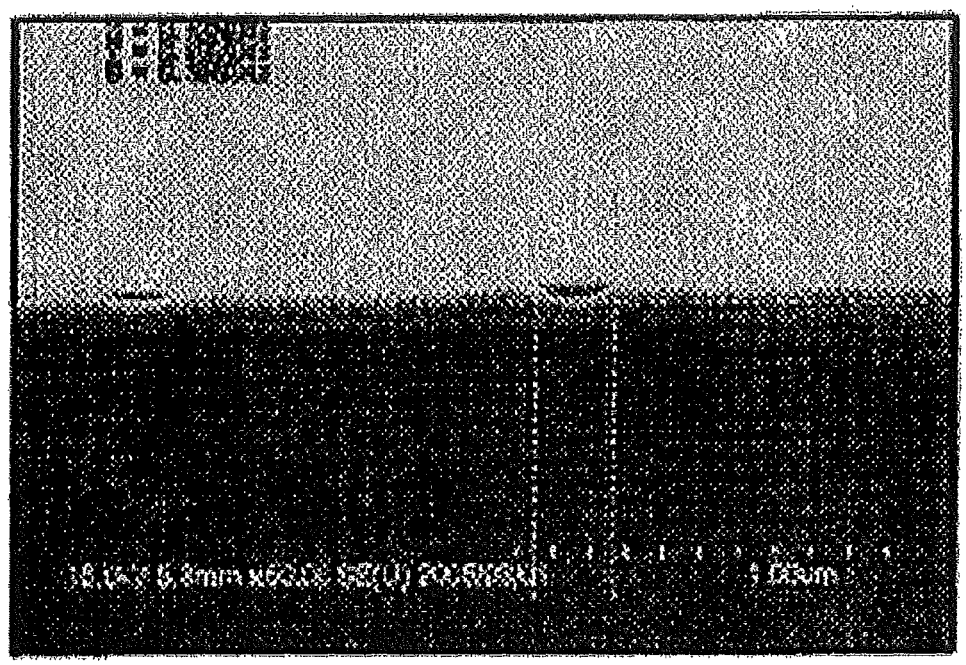
FIG. 18 is an electron micrograph of a silicon surface after removing an aluminum film.
Figure 19:
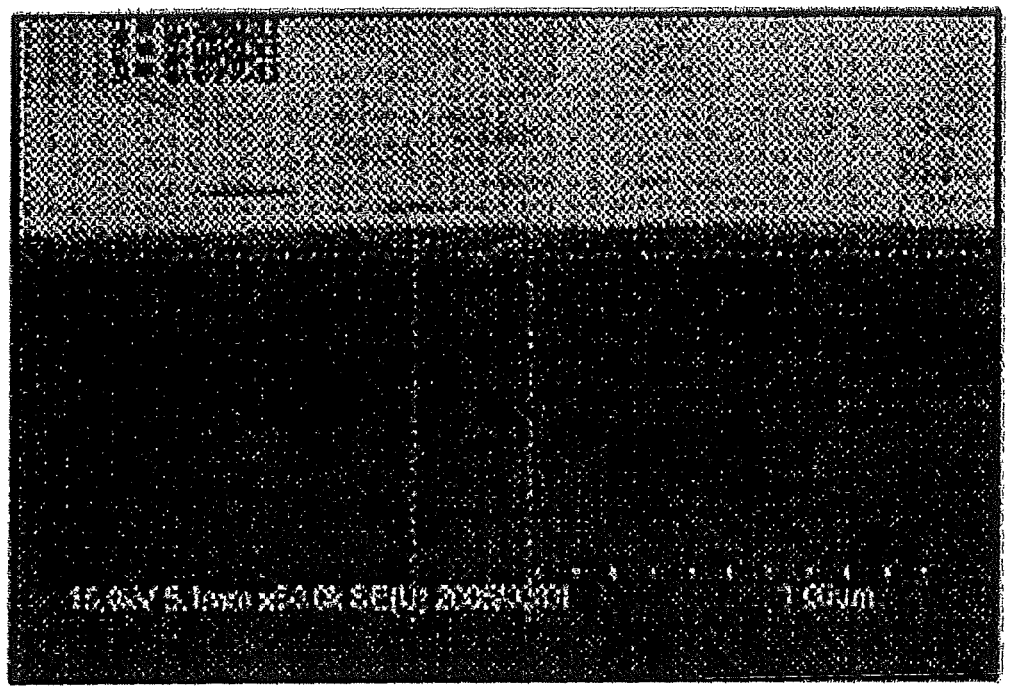
FIG. 19 is an electron micrograph of a silicon surface after removing an aluminum film.

FIG. 16 and FIG. 17 are photos of the samples with aluminum film thicknesses of 0.4 μm and 0.6 μm, respectively. Cross-sections of these samples were observed by the electron microscope and are shown in FIG. 18 and FIG. 19. FIGS. 16 through 19 indicate that the flaws due to aluminum spikes were smaller. A sample with an aluminum film thickness of 0.3 μm also showed relatively small flaws.

Figure 20:
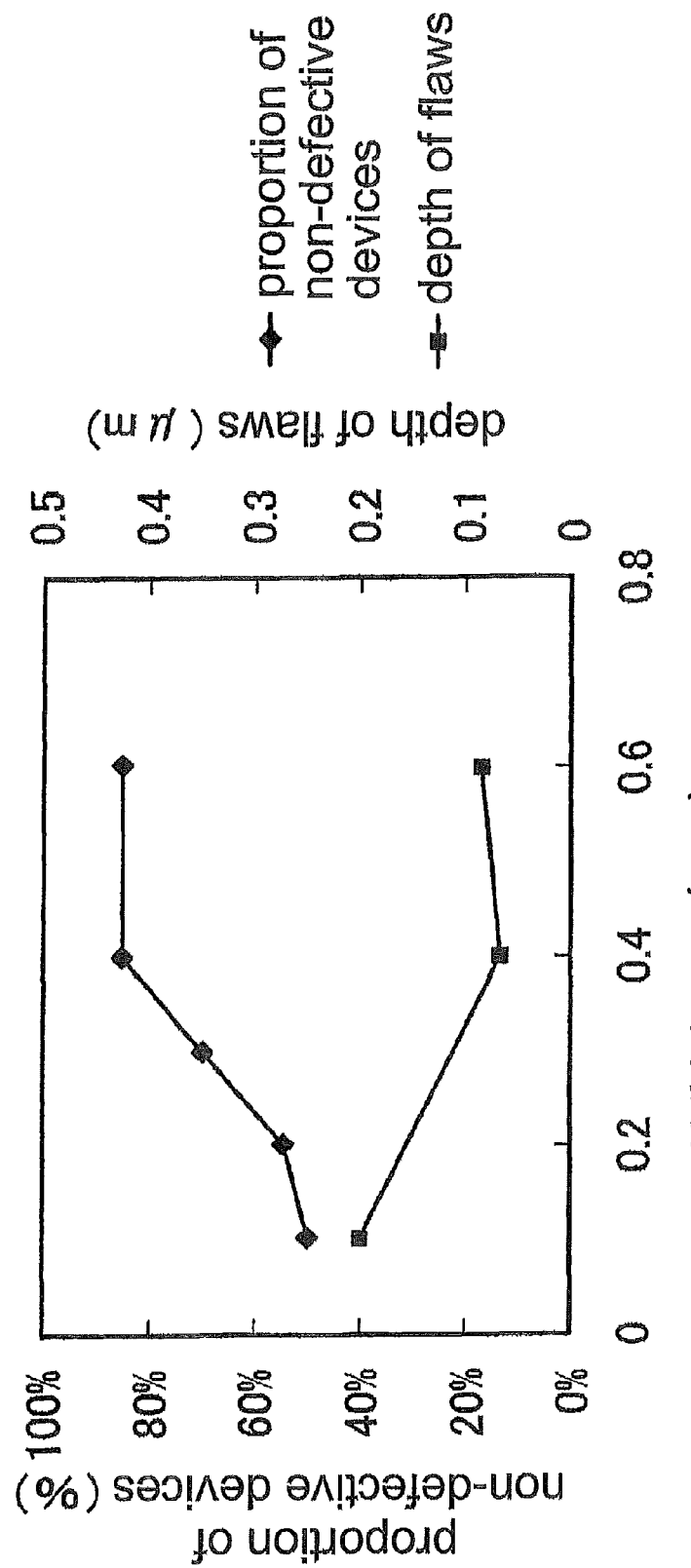
FIG. 20 shows the depth of flaws due to aluminum spikes and the proportion of non-defective devices in dependence on the thickness of the aluminum film.

Thus, the second embodiment prevents generation of aluminum spikes when the first layer of a multilayer electrode is composed of an aluminum film having a thickness of at least 0.3 μm. FIG. 20 shows depth of flaws due to aluminum spikes and the proportion of non-defective devices in dependence on aluminum film thickness. As shown in FIG. 20, when the aluminum film thickness is at least 0.3 μm, the flaws due to aluminum spikes are shallower than the thickness of the collector layer 8, for example, and the proportion of non-defective devices is improved.

Figure 21:
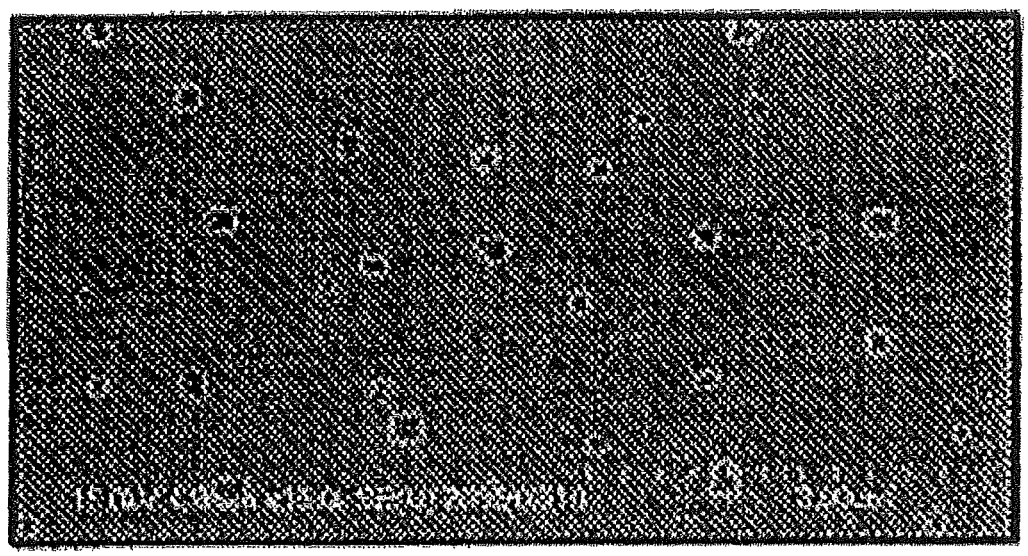
FIG. 21 is an electron micrograph of a silicon surface after removing an aluminum-silicon film.
Figure 22:
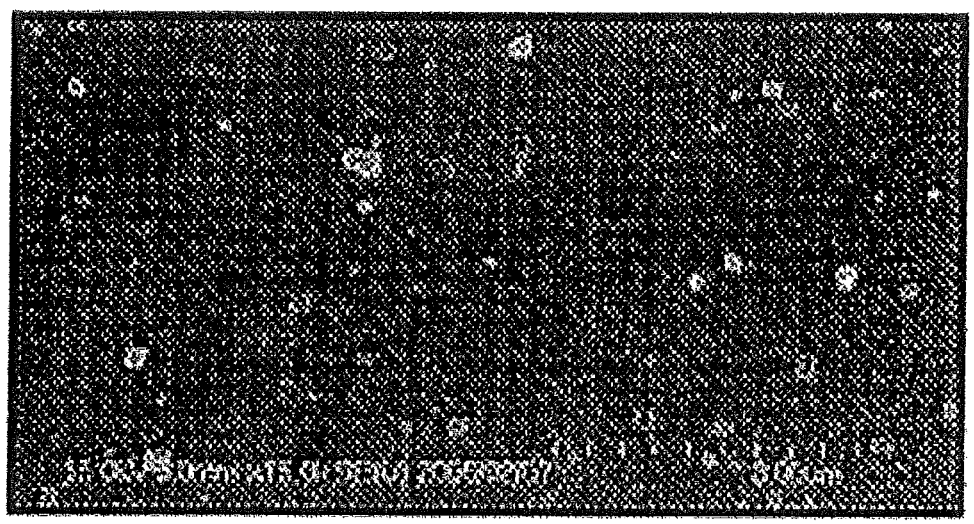
FIG. 22 is an electron micrograph of a silicon surface after removing an aluminum-silicon film.
Figure 23:
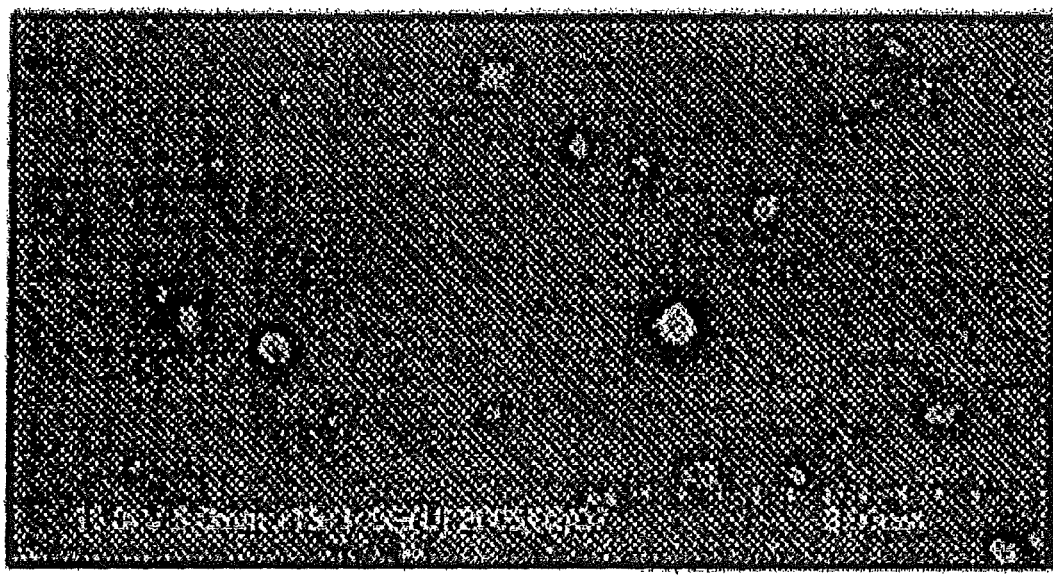
FIG. 23 is an electron micrograph of a silicon surface after removing an aluminum-silicon film.

FIGS. 21 through 23 are electron micrographs showing surface conditions of the samples prepared by forming a multilayer electrode, the first layer of which is an aluminum-silicon film, on a silicon surface by sputtering, followed by heat treatment, and removing the electrode using aqua regia to expose the silicon surface. FIG. 21 is a photo of a sample with an aluminum-silicon film thickness of 0.1 μm. Flaws generated on the silicon surface by aluminum spikes can be observed.

FIG. 22 and FIG. 23 are photos of the samples having aluminum-silicon films with thicknesses of 0.4 μm and 0.6 μm, respectively. No flaw due to aluminum spikes is observed in either of these photos. A similar result has been obtained in a sample with a thickness of an aluminum-silicon film of 0.3 μm. A thickness of aluminum-silicon film of 0.4 μm or more in particular, never generates any flaw due to aluminum spikes. Although some pieces called silicon modules still exist, they have no unfavorable effect on the proportion of non-defective devices.

Figure 24:
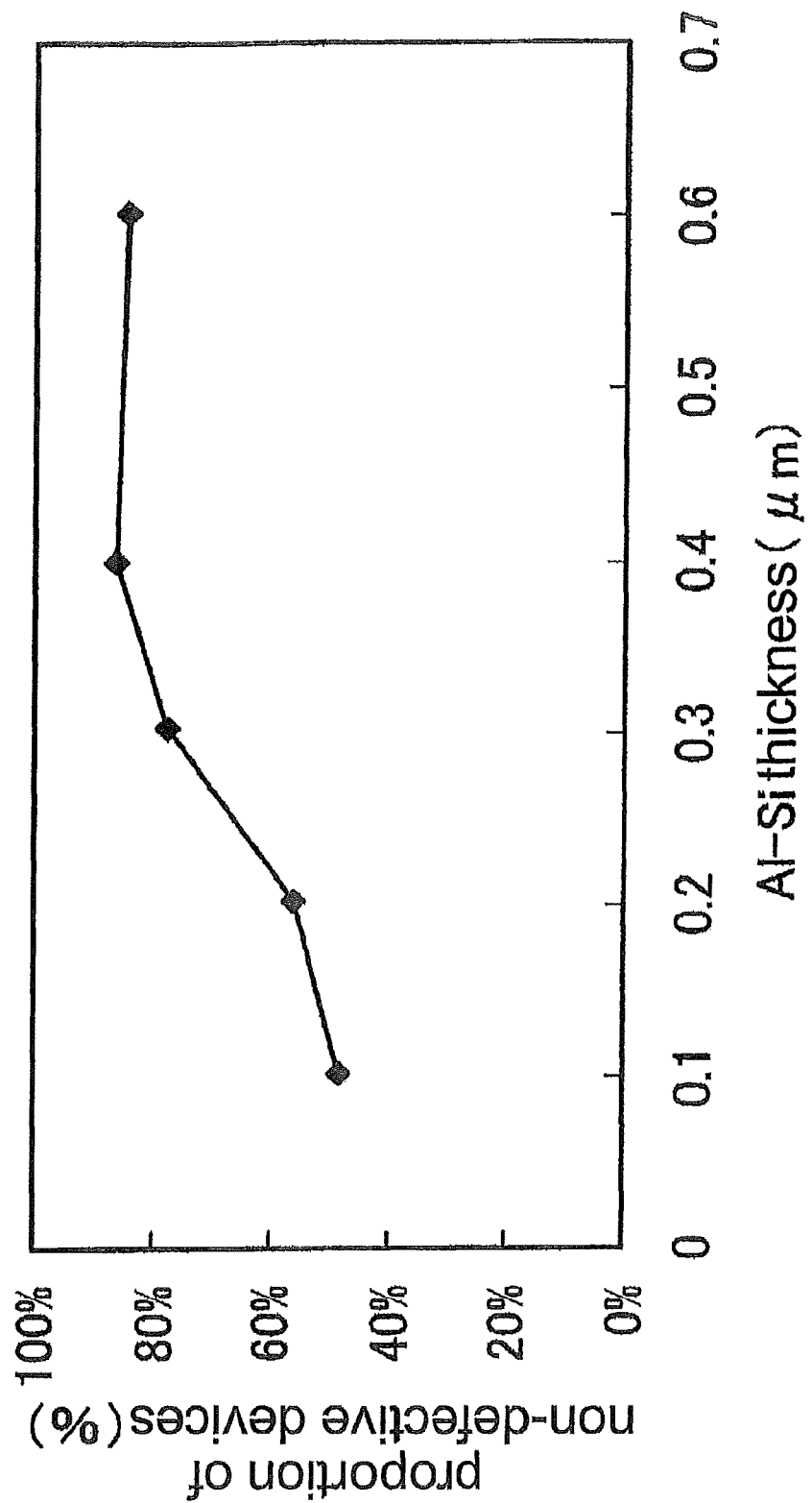
FIG. 24 shows the proportion of non-defective devices in dependence on the thickness of the aluminum-silicon film.

According to the second embodiment, generation of aluminum spikes is prevented with a first layer of a multilayer electrode composed of aluminum-silicon film having a thickness of at least 0.3 μm. FIG. 24 shows a result of a study on the relation between the thickness of the aluminum-silicon film and the proportion of non-defective devices. It is apparent from FIG. 24 that a thickness of the aluminum-silicon film of 0.3 μm or more results in an improvement in the proportion of non-defective devices.

Figure 25:
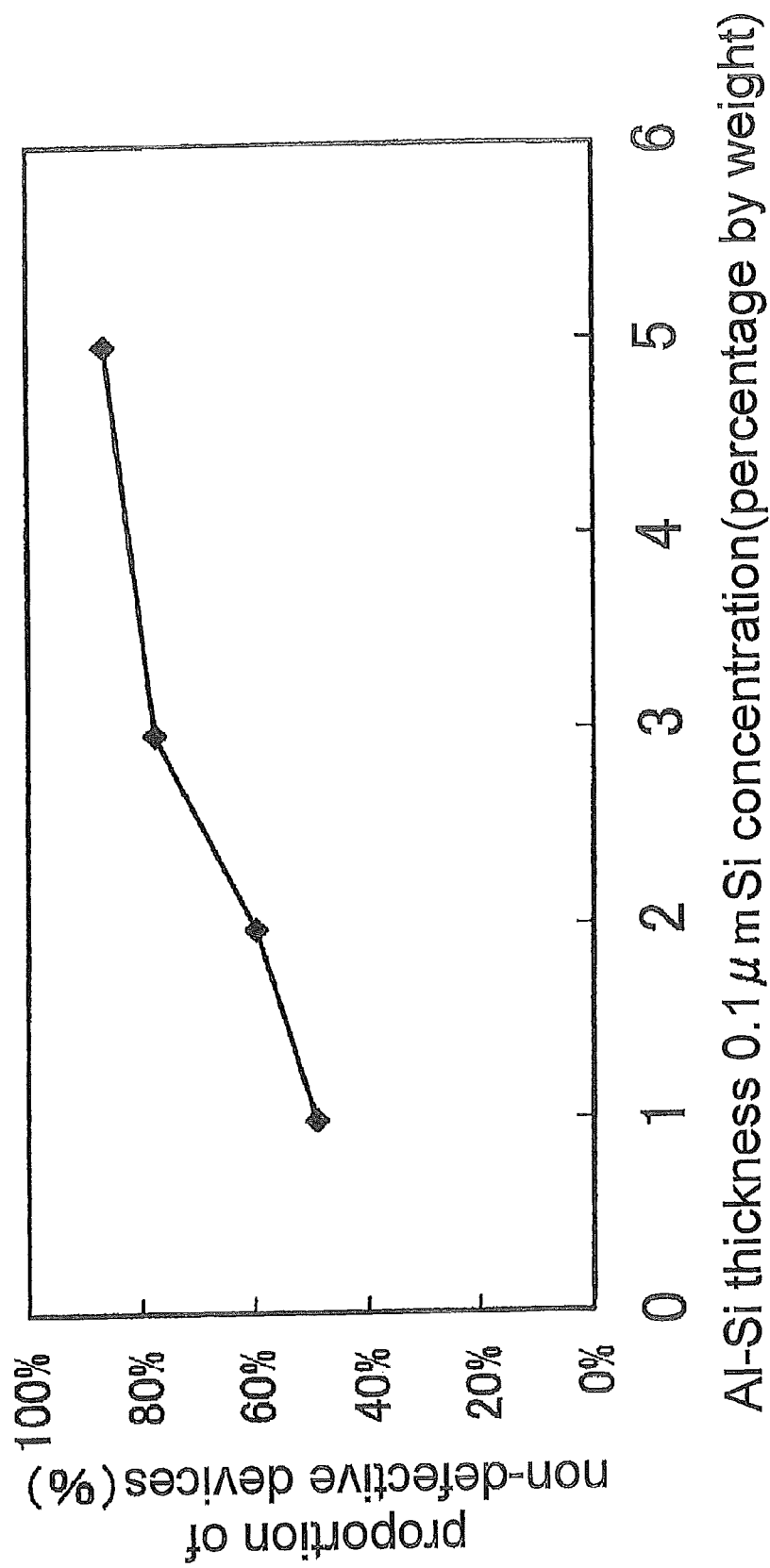
FIG. 25 shows the proportion of non-defective devices in dependence on the silicon concentration of the aluminum-silicon film.

FIG. 25 shows a result of a study on the relationship between the silicon concentration and the proportion of non-defective devices for various silicon concentrations in aluminum-silicon films prepared by changing target materials in the sputtering apparatus, with a fixed thickness of the aluminum-silicon film of 0.1 μm. It is apparent from FIG. 25 that a silicon concentration of the aluminum-silicon film of 2 percent by weight or more improves the proportion of non-defective devices. Thus, when the first layer of the multilayer electrode is composed of an aluminum-silicon film having a relatively small thickness, for example thinner than 0.3 μm, the second embodiment also prevents generation of aluminum spikes by setting the silicon concentration at least 2 percent by weight.

The present invention shall not be limited to the embodiments described above, but any variation and modification is possible within the spirit and scope of the invention. For example, in the above embodiments, the first conductivity type is n type and the second conductivity type is p type. However, the invention is also effective when the first conductivity type is p type and the second conductivity type is n type.

As described above, the method of producing a semiconductor device according to the invention is useful for producing a semiconductor device with a thin device thickness. This method is particularly suitable for producing power semiconductor devices including IGBTs that are applied to industrial apparatus such as general purpose inverters, ac servo systems, uninterruptible power supplies (UPSs), and switching power supplies, and consumer appliances such as microwave ovens, electric rice cookers, and electric flash lights.

What is claimed is:

1. A method of producing a semiconductor device that has a silicon substrate including a first major surface and a second major surface thereof, a front surface device structure being formed in a region of the first major surface, the method comprising:

forming a rear electrode in a region of the second major surface, including evaporating or sputtering aluminum-silicon onto the second major surface to form an aluminum silicon film as a first layer of the rear electrode, the aluminum silicon film having a silicon concentration of at least 2 percent by weight and a thickness of less than 0.3 μm.

2. The method of claim 1, further comprising forming a buffer metal film on a surface of the aluminum-silicon film.

3. The method of claim 2, further comprising:

forming a soldering metal film on a surface of the buffer metal film; and forming a protective metal film on a surface of the soldering metal film.

4. The method of claim 2, wherein the buffer metal film includes titanium or molybdenum.

5. The method of claim 1, further comprising providing the silicon substrate having a thickness of 50 μm to 200 μm, before forming the aluminum-silicon film.

6. The method of claim 1, further comprising producing a field stop type insulated gate bipolar transistor that includes, between the first major surface and the second major surface of the silicon substrate, a drift layer of a first conductivity type, a buffer layer of the first conductivity type, and a collector layer of a second conductivity type in a sequence from the first major surface, the collector layer being in contact with the aluminum-silicon film.

* * * * *